United States Patent
Suzuki et al.

[11] Patent Number: 5,995,374
[45] Date of Patent: Nov. 30, 1999

[54] RESIN-COATED MOUNT SUBSTRATE AND METHOD OF PRODUCING THE SAME

[75] Inventors: Masataka Suzuki; Hiroyuki Ashiya; Yayoi Maki; Atsushi Masuda, all of Shizuoka, Japan

[73] Assignee: Yazaki Corporation, Tokyo, Japan

[21] Appl. No.: 09/064,605

[22] Filed: Apr. 23, 1998

[30]    Foreign Application Priority Data

Apr. 28, 1997    [JP]    Japan .................................... 9-111483

[51] Int. Cl.$^6$ ...................................................... H05K 5/06
[52] U.S. Cl. ......................... 361/767; 361/760; 361/764; 361/796; 361/746; 361/728; 361/752; 361/750; 361/748; 361/736; 174/50; 174/52.2; 257/678; 264/272.17; 264/272.11; 442/396
[58] Field of Search ..................................... 361/767, 760, 361/764, 796, 746, 728, 752, 750, 748, 736, 784, 818, 816, 813; 264/272.11, 272.17; 174/50, 35 R, 35 MS, 52.2; 257/678

[56]    References Cited

U.S. PATENT DOCUMENTS

| | | | |
|---|---|---|---|
| 3,909,504 | 9/1975 | Browne | 174/52.2 |
| 4,942,454 | 7/1990 | Mori et al. | 257/676 |
| 5,013,900 | 5/1991 | Hoppe | 235/492 |
| 5,051,275 | 9/1991 | Wong | 427/58 |
| 5,179,039 | 1/1993 | Ishida et al. | 264/272.17 |
| 5,302,850 | 4/1994 | Hara | 257/667 |
| 5,570,272 | 10/1996 | Variot | 361/723 |
| 5,739,463 | 4/1998 | Diaz et al. | 174/35 R |

*Primary Examiner*—Leo P. Picard
*Assistant Examiner*—David Foster
*Attorney, Agent, or Firm*—Sughrue, Mion, Zinn, Macpeak & Seas, PLLC

[57]    ABSTRACT

A substrate unit is constituted by a printed substrate on which electronic parts such as a relay block is mounted, and at least printed circuit conductors and terminals in the printed substrate and relay block are buried in a sealing resin material hardened in a bag-like body of a thin resin film set in an injection mold, and the hardened sealing resin material is then released from the injection mold together with the bag-like body.

5 Claims, 4 Drawing Sheets

RESIN-COATED MOUNT SUBSTRATE AND METHOD OF PRODUCING THE SAME

BACKGROUND OF THE INVENTION

The present invention relates to a resin-coated mount substrate constituting, for example, an electronic circuit of an electronic controller mounted on a car, and relates to a method of producing such a resin-coated mount substrate.

A resin-coated mount substrate is configured such that a substrate unit in which various electronic parts are mounted on a printed substrate is resin-coated with a sealing resin material for the purpose of performing waterproof, moisture-proof, corrosion-proof, and/or heat release, etc.

Conventionally, such a resin-coated mount substrate is produced by the following method.

A resin-coated mount substrate 100 shown in FIG. 4 is disclosed in Japanese Patent Unexamined Publication No. Sho. 60-54457. The substrate 100 is formed in such a manner that electronic parts such as a resistance 102, a transistor 103, and a microcomputer 104 are mounted on a printed substrate 101 to constitute a substrate unit A, the substrate unit A is attached in a casing 110, and then a sealing resin material 111 is injected into the casing 110 and hardened so that the substrate unit A is buried in the sealing resin material 111. The resin-coated mount substrate 100 is used as it is in the state where the hardened sealing resin material 111 and the casing 110 are integrally formed with each other, and the casing 110 is used as an exterior casing as it is.

Alternatively, the resin-coated mount substrate 100 may be formed by using a tray-like casing for injecting sealing resin in place of the casing 110 used as an exterior casing. In this case, a tray-like casing and a sealing resin material are integrated with each other and the thus obtained integrated member is accommodated in a further separately prepared exterior casing for practical use.

Various techniques similar to the resin-coated mount substrate 100 are disclosed in Japanese Patent Unexamined Publications No. Sho. 59-112700 and No. Sho. 60-17990; Japanese Utility Model Unexamined Publications No. Sho. 60-11475, No. Sho. 60-94882, and No. Sho. 61-134082; etc.

Further, a resin-coated mount substrate 200 shown in FIGS. 5(a) and 5(b) is formed in such a manner that a substrate unit B in which various electronic parts (not shown) are mounted on a printed substrate is set into an injection mold 201, and thereafter a sealing resin material 202 is injected into the injection mold 201 and hardened so that the substrate unit B is buried in the sealing resin material 202 (see FIG. 5(a)), and then the hardened sealing resin material 202 is released from the mold 201 (see FIG. 5(b)). The resin-coated mount substrate 200 is accommodated in a further separately prepared exterior casing for practical use.

One problem with the resin-coated mount substrate 100, however, is that when the casing 110 is used as an exterior casing, a large quantity of the sealing resin material 111 must be injected into the casing 110 increasing the weight. Additionally, in the case of performing molding by using a tray-like casing for injecting sealing resin, the exterior casing is increased in size to secure a space for accommodating the tray-like casing.

The resin-coated mount substrate 200 can solve the foregoing problem with the resin-coated mount substrate 100. The substrate 200, however, has a problem with adhesion between the sealing resin material 202 and the injection mold 201, even in the case where a mold releasing agent is applied. This adhesion makes mold releasing troublesome and there are concerns that stress applied to the substrate at the time of mold releasing will generate a crack in the substrate or damage the conductor portions. As a result, the workability and reliability is poor.

SUMMARY OF THE INVENTION

Therefore, an object of the present invention is to provide a resin-coated mount substrate in which the exterior casing is not increased in weight as well as size and which is produced easily with high reliability, and to provide a method of producing such a resin-coated mount substrate.

In order to achieve the above object, according to a first aspect of the invention, a resin-coated mount substrate is characterized in that, in a substrate unit constituted by a printed substrate on which various electronic parts are mounted, at least conductor portions of the printed substrate and the electronic parts are buried in a sealing resin material which is hardened in a bag-like body made of a thin resin film set in an injection mold, and the hardened sealing resin material is released from the injection mold together with the bag-like body.

Therefore, according to the invention of the first aspect, the sealing resin material which is hardened so that at least the conductor portions of the printed substrate and electronic parts of the substrate unit are buried therein is released from the mold together with the bag-like body. The mold releasing at this time can be easily performed in the state where no stress is applied onto the substrate because the bag-like body is interposed between the hardened sealing resin material and the injection mold.

Further, after mold releasing, the bag-like body is in a state that it is integrally stuck on an outside surface of the hardened sealing resin material so that the bag-like body is accommodated as it is in an exterior casing for practical use. Because the bag-like body is formed of a thin resin film, the exterior casing in this case can be made compact without increasing its size.

Further, according to a second aspect of the invention, a method of producing a resin-coated mount substrate is characterized by comprising the steps of: preparing a bag-like body of a thin resin film by shaping in accordance with a mold shape of an injection mold; setting the bag-like body into the injection mold; setting a substrate unit into the bag-like body, the substrate unit having various electronic parts mounted on a printed substrate; injecting a melted sealing resin material into the bag-like body so that at least conductor portions of the printed substrate and the electronic parts of the substrate unit are buried in the sealing resin material; and releasing the hardened sealing resin material together with the bag-like body from the mold.

Therefore, according to the invention of the second aspect, the bag-like body is set in the injection mold because the bag-like body is formed of a thin resin film so that the bag-like body cannot keep its vessel-like shape by itself at the time of injection of resin. The substrate unit is set in the bag-like body which has been set, and then, the melted sealing resin material is injected into the bag-like body. At this time, the injection of the sealing resin material is limited to a quantity so that at least the conductor portions of the printed substrate and electronic parts of the substrate unit can be buried in the sealing resin material to thereby prevent the weight from increasing by excessive injection. Then, the sealing resin material is hardened so that at least the conductor portions of the printed substrate and electronic parts of the substrate unit are buried in the sealing resin material, and the hardened sealing resin material is released from the mold together with the bag-like body.

The mold releasing at this time can be easily performed, because the bag-like body is interposed between the hardened sealing resin material and the injection mold so that the sealing resin material does not adhere to the injection mold and no stress is applied onto the substrate.

DETAILED DESCRIPTION OF THE INVENTION

A preferred embodiment of the present invention will be described below with reference to the accompanied drawings.

Figure 1:
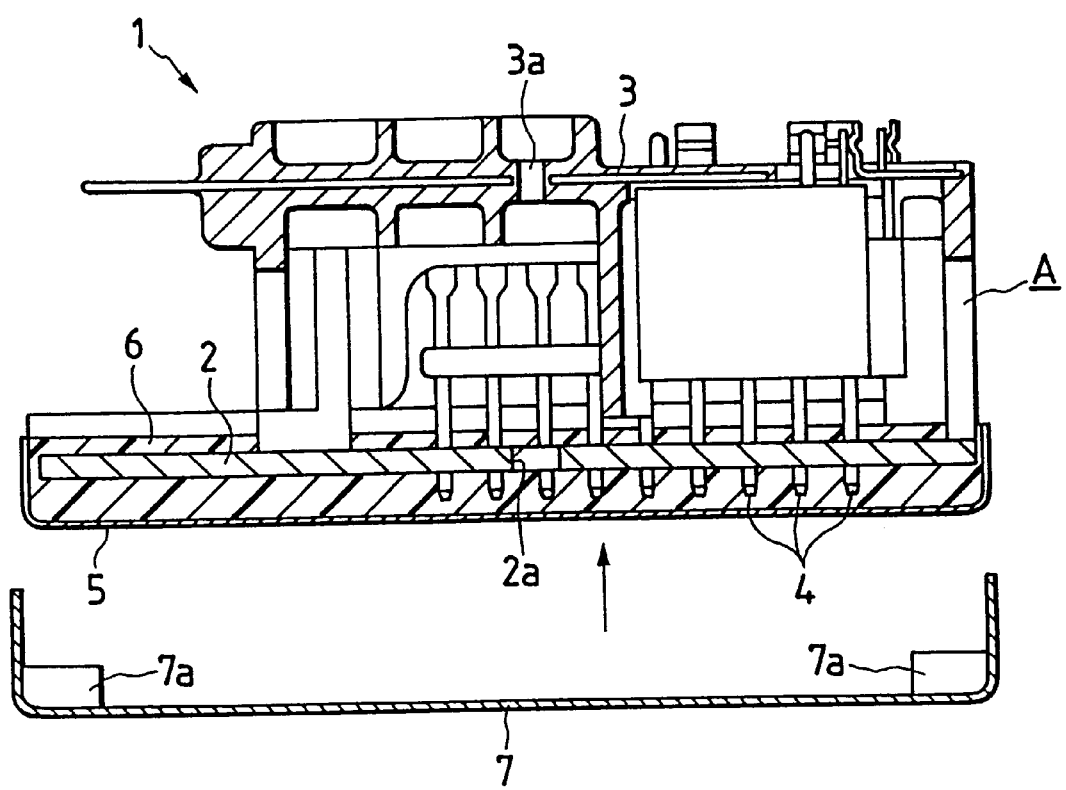
FIG. 1 is a sectional view for explaining a mold releasing step in a method of producing the resin-coated mount substrate, as an embodiment of the present invention.

FIG. 1 shows a resin-coated mount substrate 1 which is an embodiment of the present invention.

In the resin-coated mount substrate 1, a substrate unit A is constituted by a printed substrate 2 on which electronic parts such as a relay block 3 is mounted. At least conductor portions of the printed substrate 2 and relay block 3 are buried in a sealing resin material 6 in a bag-like body 5 of a thin resin film set in an injection mold 7, and the sealing resin material 6 is then hardened and released from the injection mold 7 together with the bag-like body 5.

In this case, the conductor portions include circuit conductors (not shown) printed on the printed substrate 2 and terminals 4 of the relay block 3 connected to the circuit conductors. The whole of the printed substrate 2 including the conductor portions is buried in the hardened sealing resin material 6. The bag-like body 5 covers that outside surface of the hardened sealing resin material 6 except its upper surface and integrally stuck on the outside surface.

Figure 2:
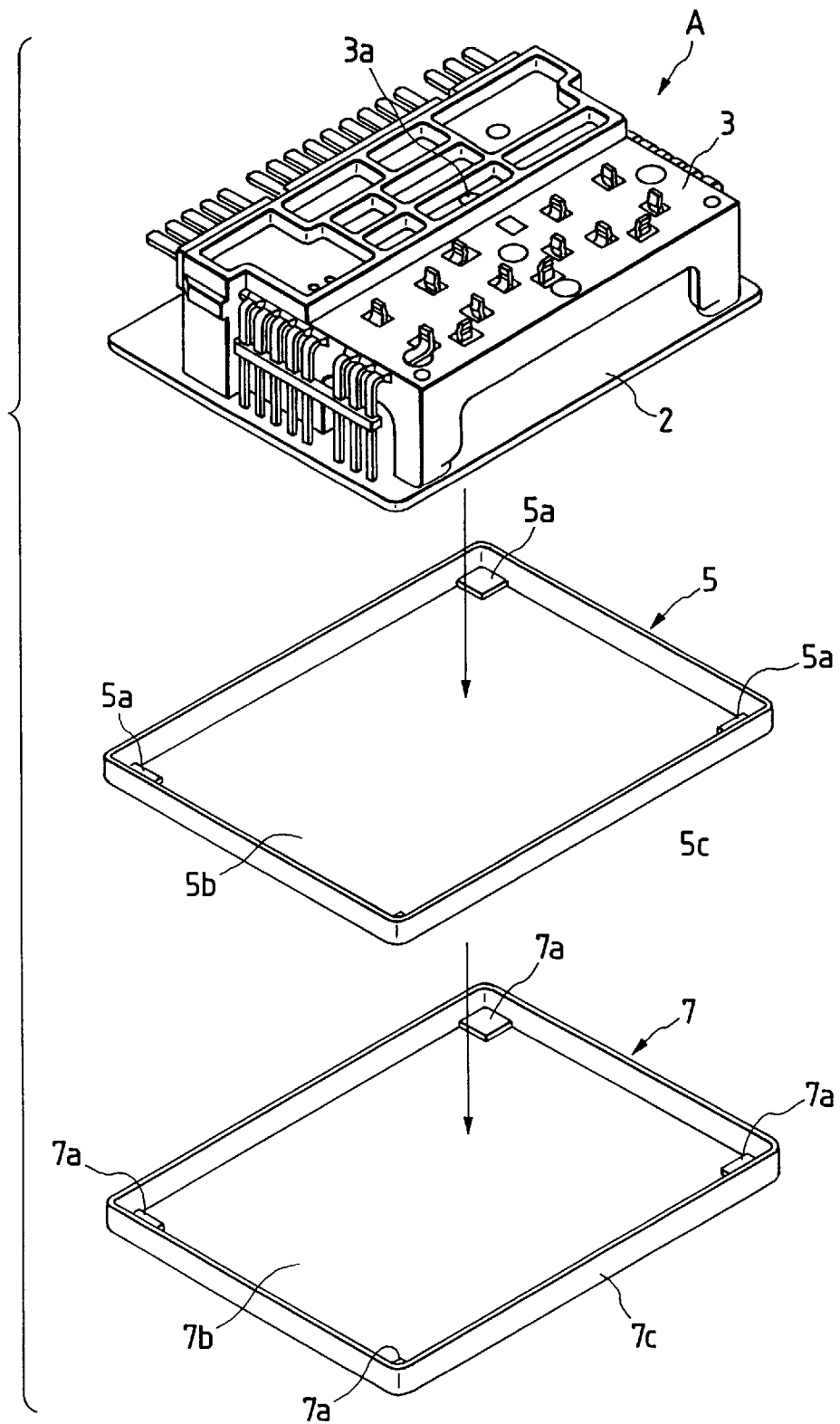
FIG. 2 is a perspective view for explaining the step of setting a substrate unit and a bag-like body in the method of producing the resin-coated mount substrate, as the embodiment of the present invention.
Figure 3A:
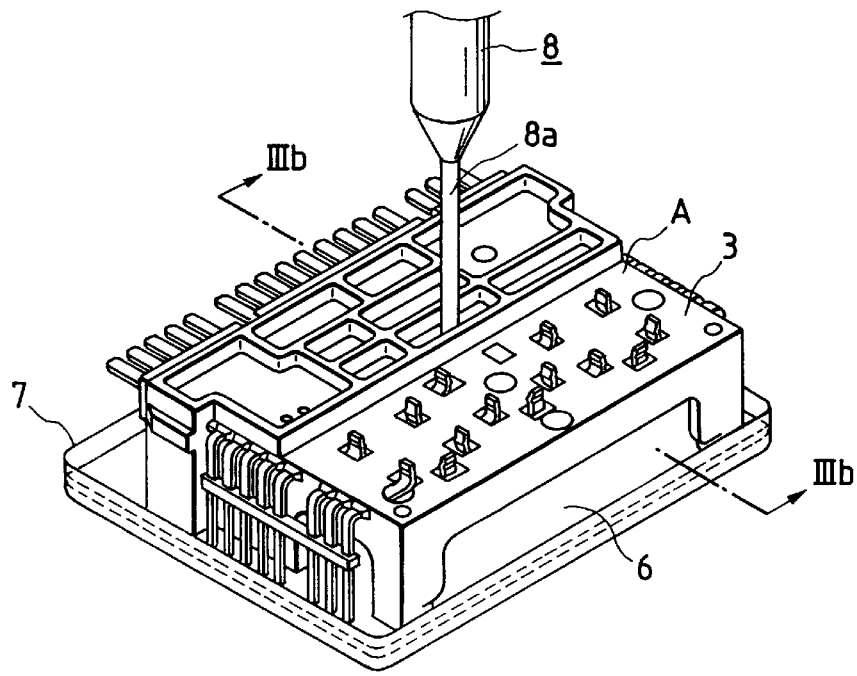
FIGS. 3(a) and 3(b) are views for explaining a sealing resin material injection step in the method of producing the resin-coated mount substrate, as the embodiment of the present invention, FIG. 3(a) being a perspective view and FIG. 3(b) being a sectional view taken along line $III_b$—$III_b$ of FIG. 3(a).

Next, a method of producing the resin-coated mount substrate 1 will be described with reference to FIGS. 2 and 3.

First, the thin-resin film bag-like body 5 formed so as to be fit to the mold shape of the injection mold 7 is set into the injection mold 7. The injection mold 7 is molded like a tray with a rectangular opening portion having an area substantially corresponding to the plane area of the printed substrate 2, and seat portions 7a formed at four corners of a bottom portion 7b of the injection mold 7 so as to project therefrom for mounting the printed substrate 2 thereon. The bag-like body 5, on the other hand, is shaped, for example, vacuum shaped by using a thin resin film (the thickness is 0.5 mm or less) such as polyethylene, polypropylene, polystyrene, or the like. The bag-like body 5 is formed into a tray-like shape so as to fit to the mold shape of the injection mold 7 in a manner so that recess portions 5a each having a caved lower surface and a projected upper surface are formed at four corners of a bottom portion 5b of the bag-like body 5 so that the recess portions 5a can be mounted on the respective seat portions 7a of the injection mold 7 from above. In this embodiment, a circumferential wall 5c of the bag-like body 5 is formed so as to be lower in height than a circumferential wall 7c of the injection mold 7. The bag-like body 5 is set in the injection mold 7 in a manner so that the recess portions 5a are fitted respectively onto the seat portions 7a, and the bottom portion 5b and circumferential wall 5c are made to be in contact with the bottom portion 7b and the circumferential wall 7c respectively. By the setting, the bag-like body 5 can keep its tray-like shape at the time of resin injection notwithstanding the fact that it is difficult to keep the shape of the bag-like body 5 because it is formed of a thin resin film.

Next, the substrate unit A having the relay block 3 mounted on the printed substrate 2 is set in the bag-like body 5 set in the foregoing step. The setting of the substrate unit A is performed by making the four corners of the lower surface of the printed substrate 2 abut and mount on the upper surfaces of the recess portions 5a of the bag-like body 5. By the setting, the printed substrate 2 is set so as to be separated up from the bottom portion 5b of the bag-like body 5 so that it is possible to secure a resin material injection space between the printed substrate 2 and the bottom portion 5b of the bag-like body 5.

Next, the melted sealing resin material 6 is injected into the bag-like body 5 so that, with respect to the substrate unit A set in the foregoing step, at least the printed circuit conductors (not shown) of the printed substrate 2 and the terminals 4 of the relay block 3 are buried in the sealing resin material 6. Injection holes 2a and 3a are bored through the printed substrate 2 and the relay block 3 respectively. A nozzle 8a of a dispenser 8 is passed through the injection holes 2a and 3a (see FIG. 3(b)) and the melted sealing resin material 6 is injected through the nozzle 8a. As the sealing resin material 6, for example, urethane resin or epoxy resin is used. At this time, the injection of the sealing resin material 6 is limited to such a quantity that at least the respective printed circuit conductors and terminals 4 of the printed substrate 2 and relay block 3, respectively, of the substrate unit A can be buried (see FIG. 3(b)) in the sealing resin material to thereby prevent the weight from increasing due to excessive injection.

Next, after the sealing resin material 6 injected in the foregoing step is hardened, the sealing resin material 6 is released from the injection mold 7 together with the bag-like body 5 (see FIG. 1). In this embodiment of the present invention, the mold releasing is performed by grasping both the relay block 3 and the injection mold 7 and separating them from each other, because the relay block 3 is projected out from the injection mold 7. The mold releasing at this time can be easily performed in the state where no stress is applied onto the printed substrate 2 because the bag-like body 5 is interposed between the hardened sealing resin material 6 and the injection mold 7 so that the sealing resin material 6 does not adhere to the injection mold 7. By the mold releasing, the resin-coated mount substrate 1 can be produced.

In the state after mold releasing where the bag-like body 5 is integrally stuck on the outside surface of the hardened sealing resin material 6, the resin-coated mount substrate 1 is accommodated, as it is, into an exterior casing (not shown) for practical use. This state of use can be made light in weight and compact in size because the bag-like body 5 is formed of a thin resin film. Accordingly, the weight is not increased and the size of the exterior casing is not enlarged.

Further, in the resin-coated mount substrate 1, mold releasing can be easily performed with no stress applied onto the printed substrate 2 because the mold releasing is carried out in a state such that the bag-like body 5 is interposed between the hardened sealing resin material 6 and the injection mold 7. As a result, the substrate 1 can be easily produced with high reliability so that no damage or the like is generated in the printed circuit conductors of the printed substrate 2 and the terminals 4 of the relay block 3 at the time of mold releasing.

Moreover, in the producing method, mold releasing can be easily performed without any trouble. Accordingly, the resin-coated mount substrate 1 having the foregoing effects can be produced under excellent workability.

Alternatively, the mold releasing step in the producing method according to the present invention may be performed as follows.

Figure 3B:
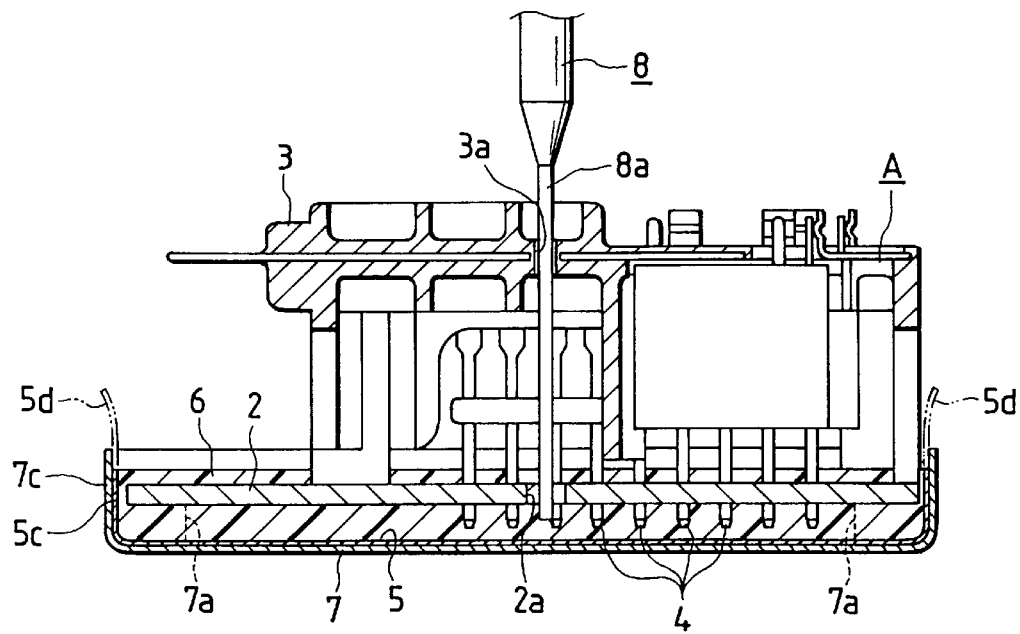
Figure 4:
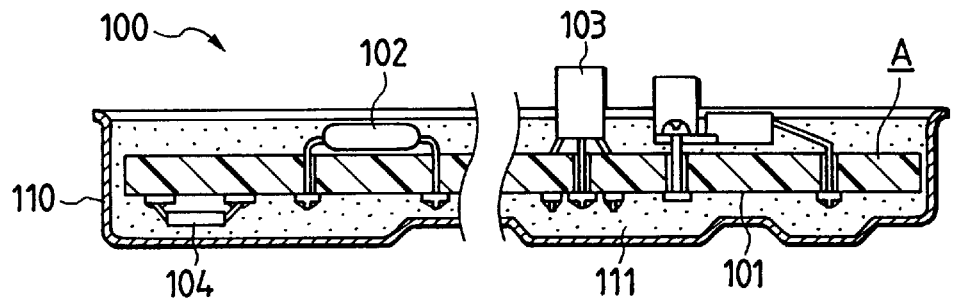
FIG. 4 is a sectional view showing an example of a conventional resin-coated mount substrate.
Figure 5A:
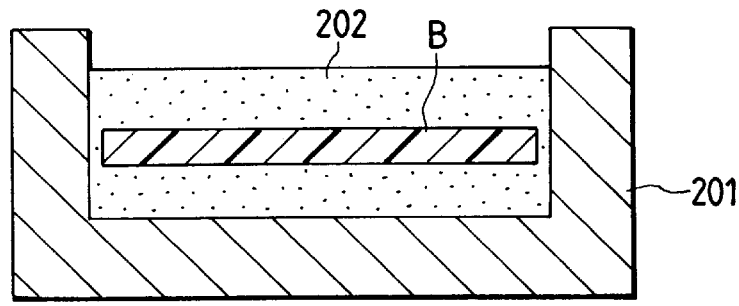
FIGS. 5(a) and 5(b) are sectional views for explaining a method of producing another example of a conventional resin-coated mount substrate, FIG. 5(a) showing a state where a sealing resin material has been injected, and FIG. 5(b) showing the state of mold releasing.
Figure 5B:
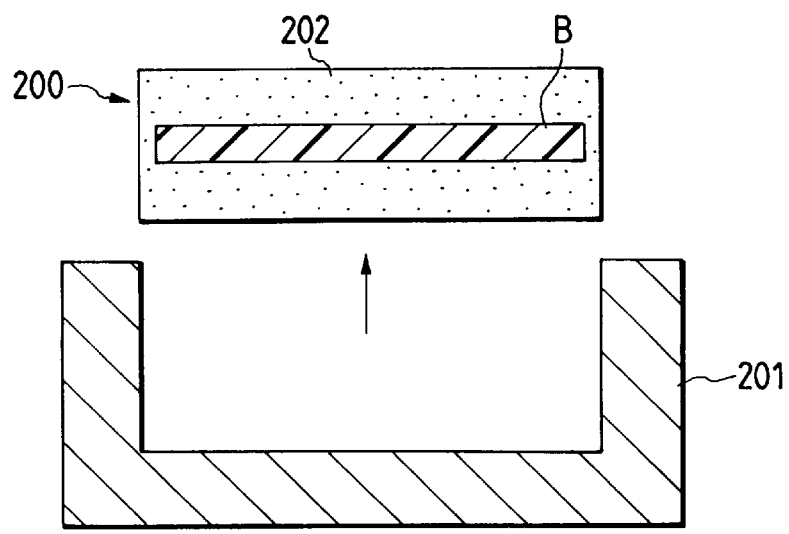

That is, mold releasing of the resin-coated mount substrate in which the electronic parts are almost or perfectly buried in the sealing resin material is performed in such a manner that the circumferential wall 5c of the bag-like body 5 is made sufficiently higher in height than the circumferential wall 7c of the injection mold 7 so that the mold releasing is performed by grasping both a projection portion 5d (see FIG. 3(b)) of the circumferential wall 5c projected up from the circumferential wall 7c and the injection mold 7 and separating the two from each other.

As described above in detail, according to the present invention, the following effects can be obtained.

That is, according to the present invention of the first aspect, the bag-like body after mold releasing is integrally stuck on the outside surface of the hardened sealing resin material and accommodated, as it is, in the exterior casing for practical use. The state of use can be made light in weight and compact in size because the bag-like body is formed of a thin resin film. Accordingly, the weight of the whole is not heavy and the size of the exterior casing is not large.

Further, according to the present invention of the first aspect, mold releasing can be easily performed with no stress applied onto the printed substrate because the bag-like body is interposed between the hardened sealing resin material and the injection mold at the time of mold releasing. As a result, it is possible to provide a resin-coated mount substrate which can be easily produced with high reliability so that no damage or the like is generated in the conductor portions of the printed substrate and the electronic parts at the time of mold releasing.

Further, according to the present invention of the second aspect, mold releasing of the hardened sealing resin material can be easily performed with no stress applied onto the printed substrate because the mold releasing is carried out in such a state that the bag-like body is interposed between the sealing resin material and the injection mold. Moreover, since the bag-like body is formed of a thin resin film, it is possible to produce the foregoing resin-coated mount substrate of the first aspect under excellent workability.

What is claimed is:

1. A resin-coated mount substrate, comprising:
    a bag-like body made of a thin resin film;
    a sealing resin material hardened in said bag-like body and fixed to an inside of said bag-like body; and
    a printed substrate on which an electronic part is mounted, wherein conductor portions of said printed substrate and said electronic part are embedded in said sealing resin material.

2. A method of producing a resin-coated mount substrate, comprising the steps of:
    preparing a bag-like body of a thin resin film by shaping said bag-like body to substantially conform with a mold shape of an injection mold;
    setting said bag-like body into said injection mold;
    setting a substrate unit into said bag-like body, said substrate unit including a printed substrate and an electronic part mounted on said printed substrate;
    injecting a melted sealing resin material into said bag-like body so that conductor portions of said printed substrate and said electronic part of said substrate unit are embedded in said sealing resin material;
    hardening said sealing resin material; and
    releasing said hardened sealing resin material together with said bag-like body from said injection mold.

3. A resin-coated mount substrate as claimed in claim 1, wherein said bag-like body is rectangular in shape and includes an open top surface that receives said printed substrate.

4. A resin-coated mount substrate as claimed in claim 3, wherein said bag-like body further comprises recess portions in at least two corners of said bag-like body, said two corners being located at opposite sides of an axis bisecting parallel sides of said bag-like body.

5. A resin-coated mount substrate, comprising:
    a body having a perimetrical side and a bottom surface, defining at least one of an interior space and an opening on a top surface, said body being made from a thin resin film;
    a substrate on which at least one electronic part is mounted, wherein a surface of said substrate including conductor portions of said printed substrate and said electronic part is disposed within said interior space of said body; and
    a sealing resin material fixing said substrate to said body, wherein said sealing resin encapsulates said conductor portions of said printed substrate and said electronic part.

* * * * *